(12) United States Patent
Sato et al.

(10) Patent No.: US 7,301,602 B2
(45) Date of Patent: Nov. 27, 2007

(54) STAGE APPARATUS AND EXPOSURE APPARATUS

(75) Inventors: Hitoshi Sato, Utsunomiya (JP); Yoshikazu Miyajima, Utsunomiya (JP); Yasuhito Sasaki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 167 days.

(21) Appl. No.: 11/094,311

(22) Filed: Mar. 31, 2005

(65) Prior Publication Data

US 2005/0219501 A1   Oct. 6, 2005

(30) Foreign Application Priority Data

Apr. 5, 2004   (JP)   ............... 2004-110837

(51) Int. Cl.
G03B 27/52   (2006.01)
G03B 27/42   (2006.01)
G03B 27/58   (2006.01)
G03B 27/32   (2006.01)
H02K 9/00   (2006.01)

(52) U.S. Cl. ............... 355/30; 355/53; 355/72; 355/77; 310/16

(58) Field of Classification Search ............... 355/30, 355/72, 75, 53, 77; 310/10, 16, 52, 307, 310/12; 359/845; 438/540; 318/135
See application file for complete search history.

(56) References Cited

U.S. PATENT DOCUMENTS

| | | | |
|---|---|---|---|
| 5,838,426 A | 11/1998 | Shinonaga et al. ............ 355/52 |
| 6,266,133 B1 | 7/2001 | Miyajima et al. ............ 355/72 |
| 6,320,649 B1 | 11/2001 | Miyajima et al. ............ 355/72 |
| 6,414,742 B1 | 7/2002 | Korenaga et al. ............ 355/53 |
| 6,487,074 B1* | 11/2002 | Kimura et al. ............ 361/695 |
| 6,583,859 B2 | 6/2003 | Miyajima et al. ............ 355/72 |
| 6,791,670 B2 | 9/2004 | Miyajima et al. ............ 355/72 |
| 2001/0001248 A1* | 5/2001 | Emoto ............ 355/53 |
| 2003/0141045 A1* | 7/2003 | Oh et al. ............ 165/104.26 |
| 2004/0130688 A1* | 7/2004 | Emoto ............ 355/30 |
| 2004/0151924 A1* | 8/2004 | Sambasivan et al. ....... 428/469 |
| 2004/0218166 A1* | 11/2004 | Vreugdewater et al. ....... 355/72 |
| 2004/0218167 A1* | 11/2004 | Hol et al. ............ 355/72 |
| 2005/0007575 A1 | 1/2005 | Miyajima ............ 355/72 |
| 2005/0254036 A1 | 11/2005 | Sasaki et al. ............ 355/72 |
| 2005/0275821 A1 | 12/2005 | Miyajima ............ 355/69 |

FOREIGN PATENT DOCUMENTS

JP   11-190786   7/1999

\* cited by examiner

*Primary Examiner*—Alan Mathews
(74) *Attorney, Agent, or Firm*—Fitzpatrick, Cella, Harper & Scinto (57) ABSTRACT

A moving element to be propelled across a stator includes a coil unit, including coils, for generating a force to propel the moving unit, and a cooling unit for cooling the coil unit. A thermal conductive member, arranged between the cooling unit and the coil unit, transmits heat away from the coil unit. In addition, a housing unit houses the coil unit, the cooling unit and the thermal conductive member.

17 Claims, 7 Drawing Sheets

STAGE APPARATUS AND EXPOSURE APPARATUS

BACKGROUND OF THE INVENTION

1. Field of the Invention

The present invention relates to a stage apparatus, and preferably to a stage apparatus that positions a substrate for an exposure apparatus.

2. Description of the Related Art

For the manufacture of highly integrated semiconductor devices, an exposure apparatus is requested that can precisely position substrates to which patterns are to be transferred. As a propelling source for a stage apparatus to be used for such positioning, attention has been called to a so-called plane motor. A plane motor can be a variable-reluctance propelled type, for example, or an electromagnetic propelled type for which the Lorentz force is used.

An example plane motor of a variable-reluctance propelled type (hereinafter referred to as a plane pulse motor) is described in Japanese Patent Laid-Open Publication No. Hei 11-190786. In Japanese Patent Laid-Open Publication No. Hei 11-190786, comb-toothed magnetic members are arranged to constitute a stator, and opposite the stator, a plurality of coils having comb-toothed portions, a permanent magnet and a yoke are arranged to constitute a moving element. With this arrangement, a current flows across the coils to change magnetic resistances and to exert a thrust for propelling the moving element. Further, a pulse current supplied to each coil is controlled to activate a stepping operation.

For the above described plane motor, a large current must be supplied to the coils to obtain a strong thrust, and heat generated by the coils becomes a problem. According to one method employed to overcome this problem, a coolant is used to cool the coils directly; however, space allocated for a coolant flow path must be increased if the coil cooling capability is to be improved, and accordingly, the overall size of the apparatus is increased. This increase in size also results in an increase in the size of a moving stage when the coils are provided in the moving section. Further, when the flow rate of the coolant is increased, vibration caused by the coolant flow can cause a disturbance. As a result, these problems hinder the achievement of an increase in accuracy.

Further, when the coils are exposed as in Japanese Patent Laid-Open Publication No. Hei 11-190786, heat generated by the coils adversely affects the optical measurement path of an interferometer provided to obtain measurements used to establish the location of the moving element, thereby reducing the positioning accuracy. These problems will be even more noticeable when, to increase the propelling force, an arrangement including many coils is employed.

SUMMARY OF THE INVENTION

In order to resolve the conventional shortcomings, according to the present invention, there is provided a stage apparatus that employs a plane motor to ensure coils are cooled efficiently while precluding the degradation of accuracy.

According to one aspect of the invention, a stage apparatus has a moving element on which an object is mounted and is propelled across a stator. The moving element includes a coil unit, including coils, for generating a force to propel the moving element, a cooling unit for cooling the coil unit, and a thermal conductive member that is arranged between the cooling unit and the coils and has a high thermal conductivity for thermal conduction in at least one direction. In addition, a housing unit houses the coil unit, the cooling unit and the thermal conductive member.

According to the present invention, the stage apparatus employing a plane motor can efficiently cool coils while precluding the degradation of accuracy.

Further features and advantages of the present invention will become apparent from the following description of exemplary embodiments (with reference to the attached drawings).

DETAILED DESCRIPTION OF THE PREFERRED EMBODIMENTS

First Embodiment

Figure 1A:
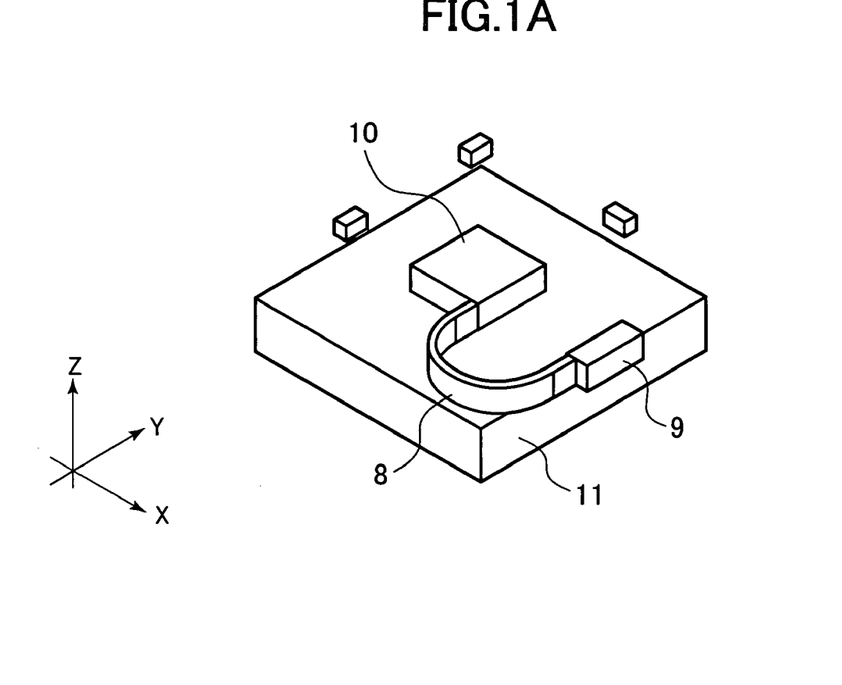
FIGS. 1A and 1B are diagrams showing a stage apparatus employing a plane motor.
Figure 1B:
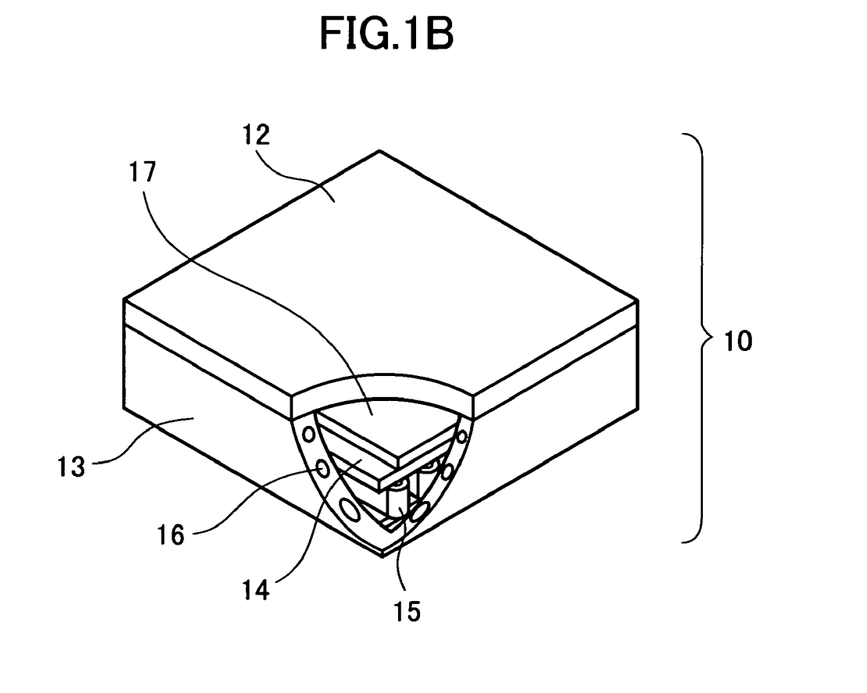

FIGS. 1A and 1B are schematic diagrams showing a stage apparatus, according to a first embodiment of the present invention, employing a plane pulse motor. In the stage apparatus, as is shown in FIG. 1A, a moving element 10 can be propelled across a stator 11. A pipe unit 8 is connected to the moving element 10, and includes a pipe and wiring for supplying a gas, a liquid, electricity and signals to the moving element 10. The pipe unit 8 is only temporarily secured to the stator 11 by a fixing unit 9, and the wiring for the pipe unit 8 is drawn out and terminated externally. The detailed structure of the moving element 10 is shown in FIG. 1B.

As is shown in FIG. 1B, the moving element 10 includes: a coil unit 15 constituted by arranging a plurality of coils; a yoke 14; and a permanent magnet 17; and a moving element frame 13 and a moving element cover 12, which together form a housing unit, which cover the components.

For the stator 11, magnetic members having a comb-tooth shape are arranged at like intervals, and opposite them, the coils of the moving element 10, which likewise have comb-toothed portions, are arranged at a different phase. With this structure, a current flowing across the coils produces a change in the magnetic resistance and generates thrust to propel the moving element 10 across the stator 11. Further, a pulse current supplied to each coil is controlled to activate the stepping operation, so that the moving element 10 can be positioned in a direction X, Y or θ (a rotational direction at the Z axis).

Figure 4:
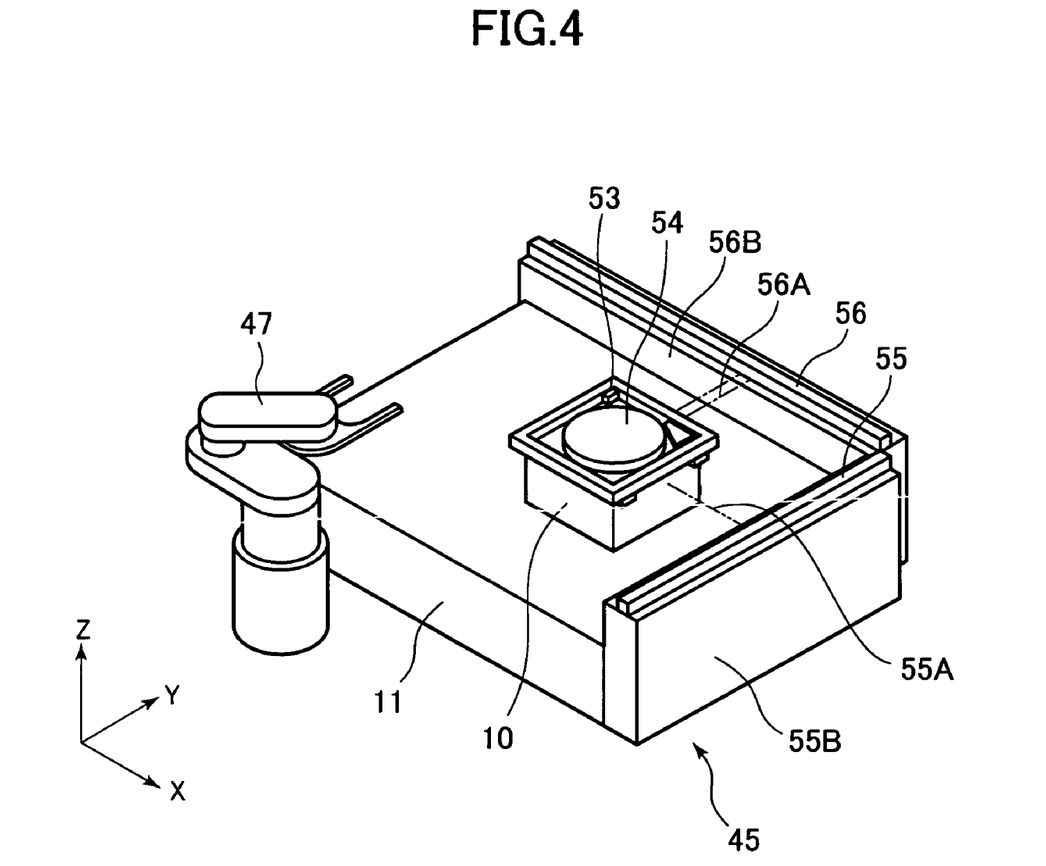
FIG. 4 is a diagram showing the optical path of an interferometer.

FIG. 4 is a diagram showing the location of a laser interferometer used for positioning a moving element. Measurement beams 55A and 56A are emitted by a laser head (not shown) mounted on the moving element 10, and are reflected by mirrors 55 and 56, so that the location of the moving element 10 in the directions X and Y can be obtained. By emitting a plurality of measurement beams in parallel, the location of the moving element 10 in the Z-axial direction (θ) can also be obtained. Furthermore, a mirror may be mounted ON the moving element 10, and a laser head may be provided outside the moving element 10.

As is described above, when the moving element 10 is propelled by supplying a current to the coils, heat generated by the coils becomes a problem. The generated heat can deform an object on the moving element 10, or another constituent member, and further, can cause thermal fluctuation of the optical measurement path of the interferometer shown in FIG. 4. Therefore, a coolant flow path 16 is provided for the moving element frame 13 for the circulation of a coolant to cool the coils. The coolant is provided by an external device (not shown) via a pipe unit 9.

As is shown in FIGS. 2A to 2D, a thermal conductive anisotropic sheet 21, which is made of a thermal conductive anisotropic material, is provided around the coils 15 of the moving element 10. The thermal conductive anisotropic sheet 21 is so arranged that it contacts the coils 15, and at least one end of the sheet 21 contacts the moving element frame 13. With this arrangement, heat generated by the heat sources, the coils 15, is transmitted to the moving element frame 13, wherein the coolant flow path 16 is internally provided.

As is described above, the thermal conductive anisotropic sheet 21 is a thermal conductive anisotropic medium that can easily transmit heat from the coils 15 to the moving element frame 13. The thermal conductive material employed here is a material having a thermal conductivity, for example, of about 10 W/(m·K). Since the thermal conductivity is low for thermal transmission in other directions, it is difficult for the heat to be transferred from the coils 15 to the other constituents, such as the moving element cover 12 and the stator 11, and as a result, the degradation of accuracy due to thermal deformation can be precluded.

Figure 2A:
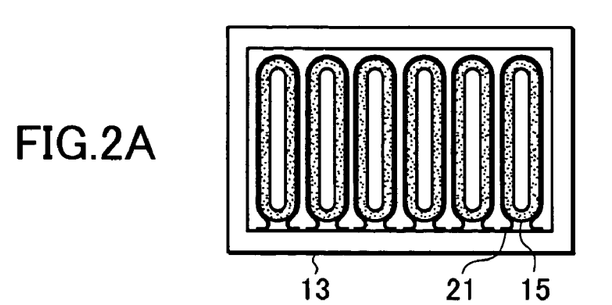
FIGS. 2A to 2D are diagrams showing sections at the periphery of a coil.
Figure 2B:
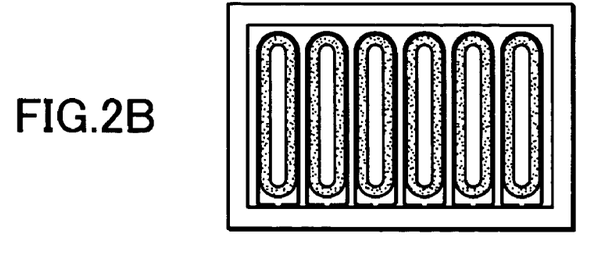
Figure 2C:
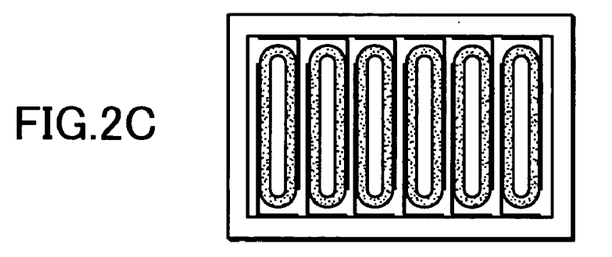
Figure 2D:
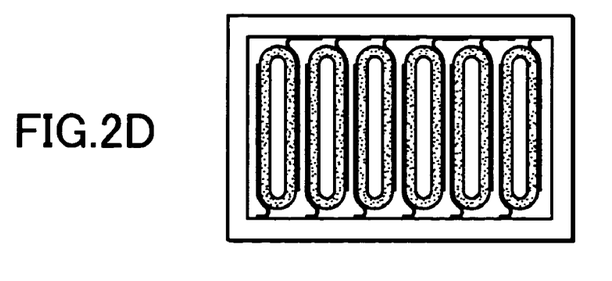

FIGS. 2A to 2D are diagrams showing example arrangements of the thermal conductive anisotropic sheet 21; as is shown in FIGS. 2A and 2B, heat may be transferred to one side (one face) of the moving element frame 13, or as is shown in FIGS. 2C and 2D, heat may be transferred to both sides (both faces) of the moving element frame 13. When the size of the area of the thermal conductive anisotropic sheet 21 contacting the coils 15 and the moving element frame 13 is as large as possible, under the circumstances, the cooling effect is improved. Therefore, it is preferable that, at contact points, gluing be used to secure the thermal conductive anisotropic sheet 21.

The coolant flow path 16 need only be provided in one of the four faces of the moving element frame 13, and heat need only be transferred, via the thermal conductive anisotropic sheet 21, to the face wherein the coolant flow path 16 is formed. In this case, since the space occupied by the coolant flow path in the moving element 10 can be reduced, the moving element 10 can be compactly made.

According to the first embodiment, since heat generated by the coils is actively transferred to the coolant flow path by using the thermal conductive anisotropic sheet, the transfer of heat to a portion for which deformation is not desirable can be prevented. Further, since the volume of the coolant prepared for the moving element can be reduced, the moving element 10 can be compactly made, and since the affect of vibration can thus be reduced, it is possible to precisely position the moving element.

In consonance with a requested positioning accuracy, a material, other than the thermal conductive anisotropic material, may be employed so long as heat can be easily transmitted, at least between the coils and the coolant flow path. An example high thermal conductive material can be a high-orientation carbonaceous fiber film having a structure similar to a single crystal, a heat transport device wherein fine tubes, carrying a working liquid, are so arranged that they reciprocate inside the sheet, or a ceramics sheet obtained by the impregnation with a special resin of a porous ceramic composed mainly of aluminum nitride.

According to the first embodiment, the size of the moving element is reduced by forming the coolant flow path inside the wall of the moving element frame. However, the location of the coolant flow path is not limited to the inside of the wall, and so long as heat is actively transferred to the coolant by the thermal conductive member, the affect of the heat generated by the coils on the optical path of the interferometer can be reduced.

Furthermore, according to this embodiment, since the thermal conductive anisotropic sheet is employed as a thermal conductive member, the space required is not large, and the size of the element can be even more reduced. However, depending on the space required, the thermal conductive member is not limited to the shape of the sheet.

Second Embodiment

FIGS. 3A to 3D are diagrams showing a stage apparatus according to a second embodiment of the present invention. The same reference numerals as those in the first embodiment are used to denote corresponding components, and no further explanation for them will be given. A difference between the first and the second embodiment is that two cooling systems are formed in the second embodiment.

Figure 3A:
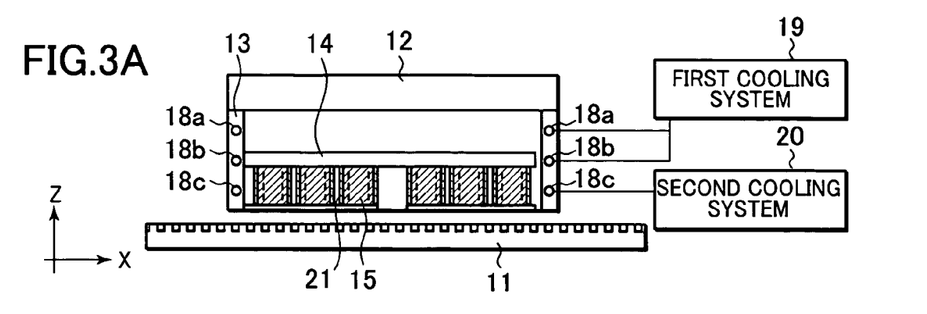
FIGS. 3A to 3D are diagrams showing two cooling systems.

A coolant flow path 18 includes coolant flow paths 18a to 18c, and in FIG. 3A, the temperature in the coolant flow paths 18a and 18b is adjusted to 23° C. by a first cooling system 19, while the temperature in the coolant flow path 18c is adjusted to 21° C. by a second cooling system 20. These temperatures may be reversed.

As is described above, when a plurality of coolant flow paths are provided in the moving element frame 13, and the temperature of at least one of the coolant flow paths is independently controlled, local heat can be removed, and as a result, a uniform temperature can be maintained.

Figure 3B:
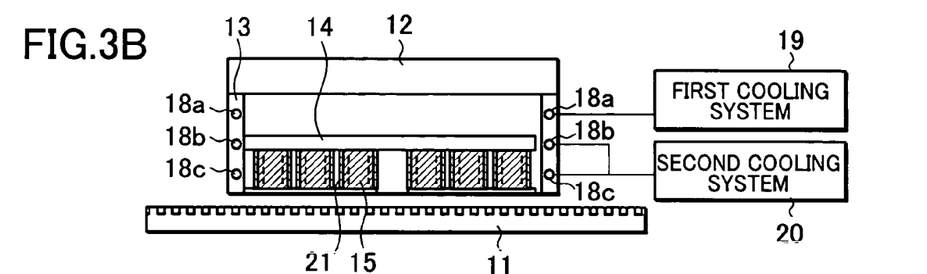
Figure 3C:
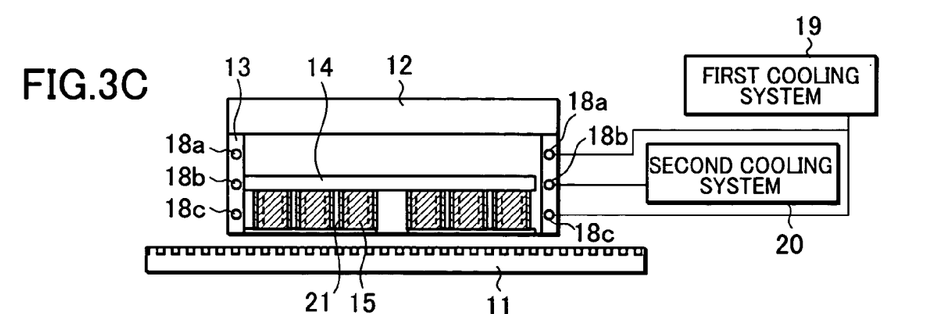
Figure 3D:
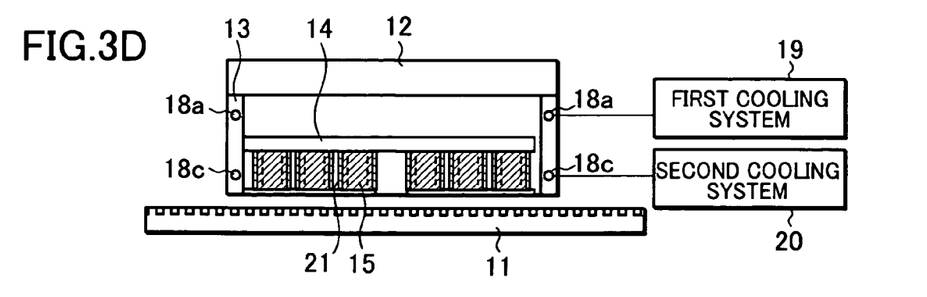

FIGS. 3B to 3D are diagrams showing other examples, and any number of coolant flow paths may be formed. In these examples, only two cooling systems are employed; however, more cooling systems may be provided.

As in the second embodiment, when a plurality of coolant paths are formed, and cooling systems for the paths differ, local heat can be removed, and further, heat can also be effectively removed from a portion of the moving element frame 13 to which heat from the thermal conductive anisotropic sheet 21 is transferred. That is, when the temperature at one portion of the moving element frame 13 that contacts the thermal conductive anisotropic sheet 21 is lower than at others, an overall, uniform temperature can be attained. Further, the individual cooling systems may change the flow rate instead of the temperature, or may even employ different coolants.

(Example Applied for an Exposure Apparatus)

Figure 5:
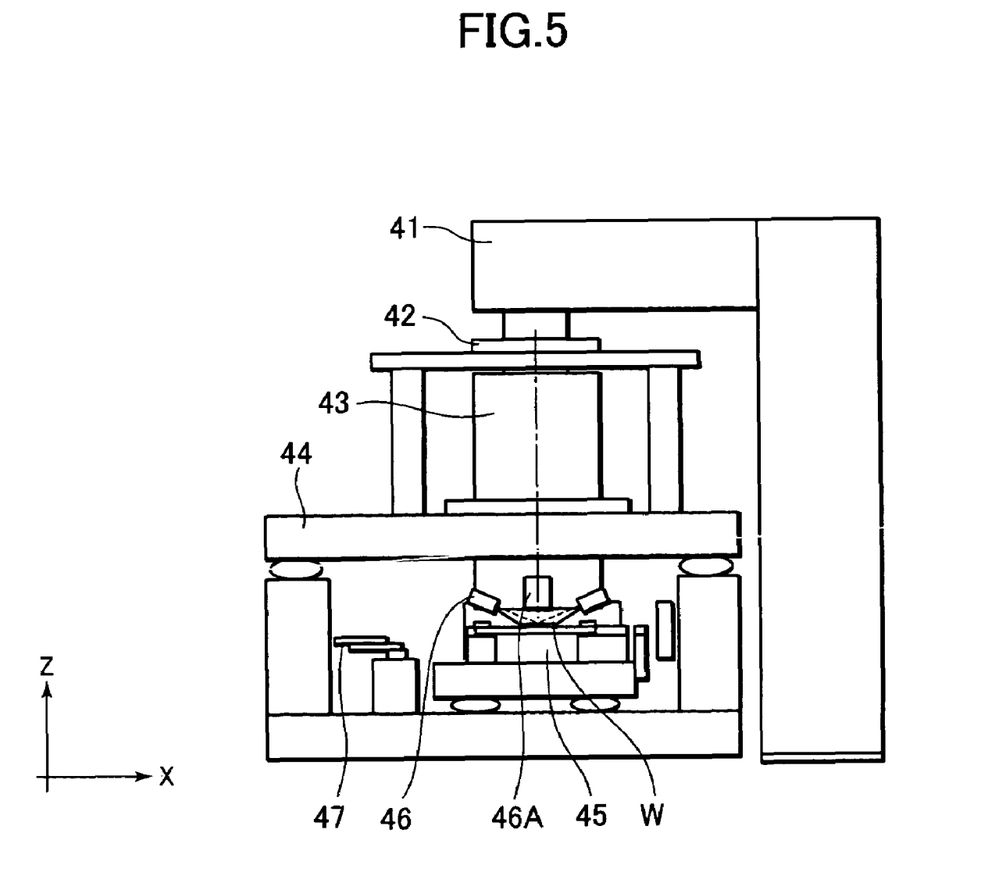
FIG. 5 is a diagram showing an exposure apparatus.

FIG. 5 is a diagram showing an exposure apparatus for which the stage apparatus of the first or the second embodiment is applied. This exposure apparatus is employed for the manufacture of a semiconductor device, such as a semiconductor integrated circuit, or a device, such as a micro machine or a thin-film magnetic head, wherein a tiny pattern is formed. Exposure light (a general term for visible light, ultraviolet light, EUV light, an X ray, an electron beam and a charged particle beam) is emitted by a lighting unit 41 through a reticle having an original form, and a semiconductor wafer (substrate) W is irradiated by this light through a projection lens 43 (a general term for a refracting lens, a reflecting lens, a reflecting/refracting lens system and a charged particle lens), which constitutes a projection system. As a result, a desired pattern is formed on the wafer W on a wafer stage 45.

The wafer W is held as an object by a chuck mounted on the wafer stage 45, and the pattern of the reticle, which is an original form mounted on a reticle stage 42, is transferred to the individual areas of the wafer W using the step and repeat drawing method or using the step and scan drawing method. The stage apparatus for the first or the second embodiment is employed as the wafer stage 45 and/or the reticle stage 42.

A focus scope 46 performs a focus measurement for a wafer, and an alignment scope 46A reads a mark on a wafer and a reference mark on a stage to perform the alignment of the wafer, and to align the wafer with the reticle. A convey robot 47 feeds a wafer to or collects a wafer from the stage apparatus.

When the stage apparatus for the first or the second embodiment is employed in this manner for an exposure apparatus, the provision of an accurate exposure apparatus is possible.

Figure 6:
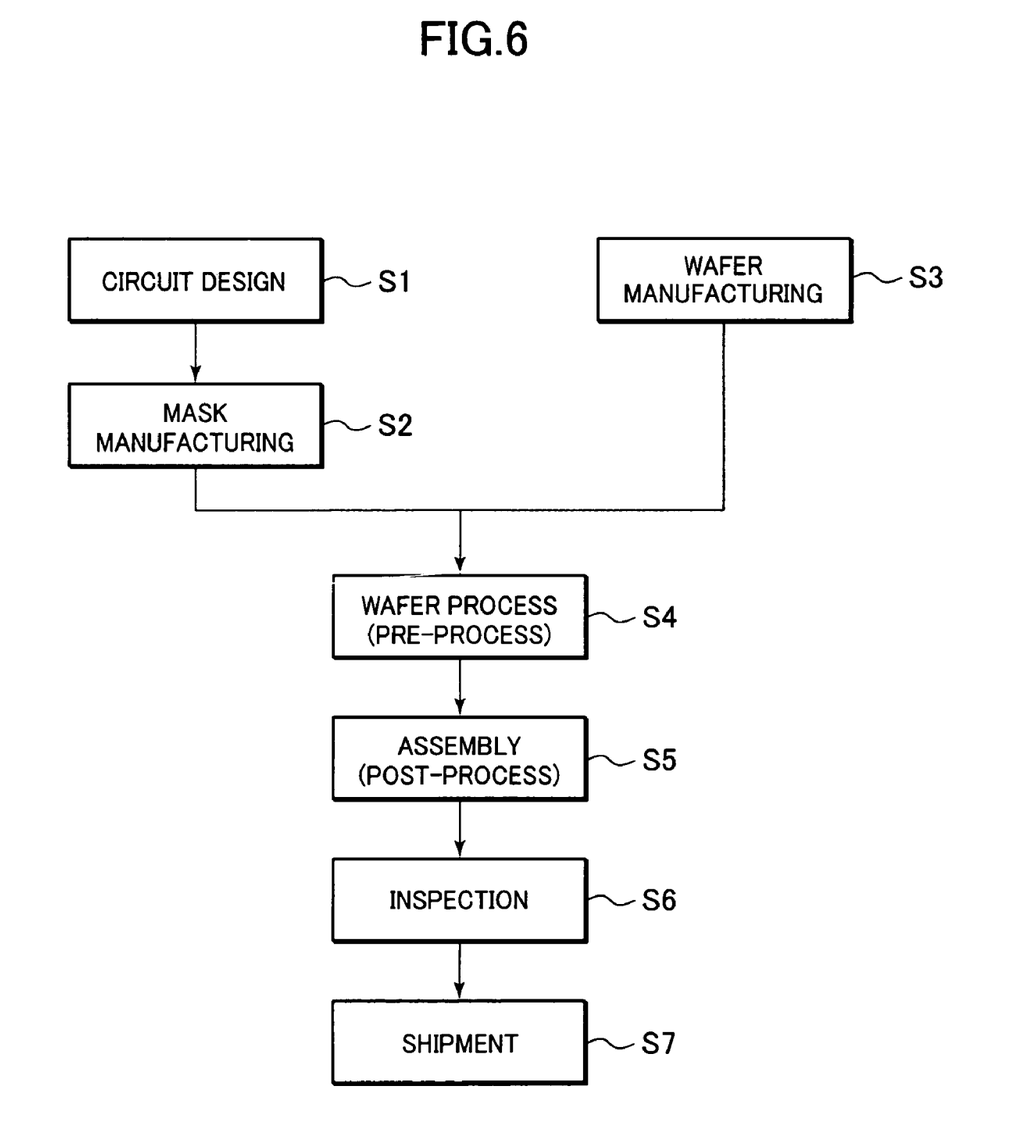
FIG. 6 is a flowchart showing a device manufacturing method.

A semiconductor device manufacturing process that uses this exposure apparatus will now be descried. FIG. 6 is a flowchart showing all the processing performed in the manufacture of a semiconductor device. At step S1 (circuit design), the circuit of a semiconductor is designed, and at step S2 (mask manufacture), a mask is manufactured based on the circuit pattern that has been designed.

At step S3 (wafer manufacture), a wafer is manufactured using a material such as silicon. Step S4 (a wafer process) is called a pre-process, during which a lithographic technique is employed, and using the mask, a circuit is actually formed on the wafer by the exposure apparatus. Step S5 (assembly) is called a post-process, during which the wafer obtained at step S4 is employed to form a semiconductor chip. This post-process includes other processes, such as an assembly process (dicing and bonding) and a packaging process (chip enclosing). At step S6 (inspection), an inspection, such as an operation confirmation test or a durability test, is conducted for a semiconductor device obtained at step S5. Through this process, the semiconductor device is completed, and is shipped at step S7.

Figure 7:
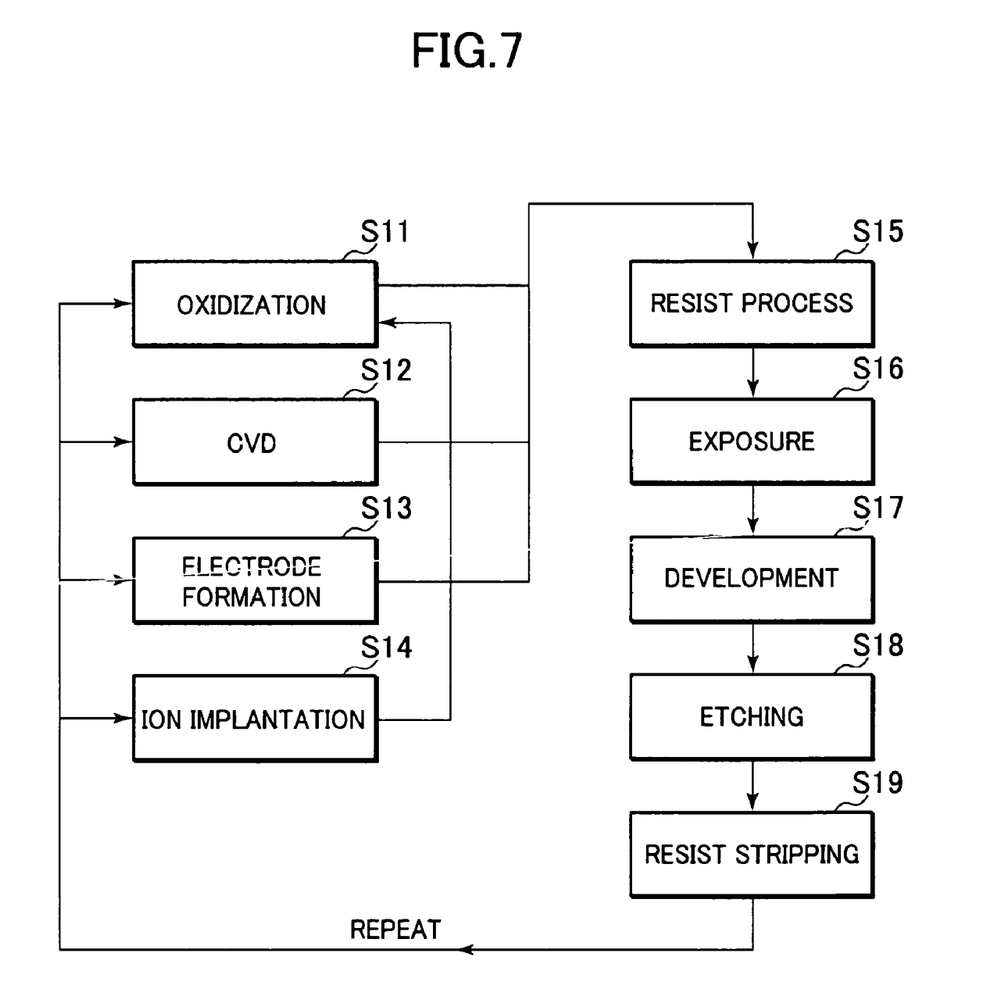
FIG. 7 is a flowchart showing a wafer process.

The wafer process at step S4 includes the following steps (see FIG. 7): an oxidization step of oxidizing the surface of a wafer; a CVD step of forming an insulating film on the surface of the wafer; an electrode formation step of using evaporation to form an electrode on the wafer; an ion implantation step of implanting ions in the wafer; a resist process step of coating the wafer with a photosensitive agent; an exposure step of employing the exposure apparatus to transfer a circuit pattern to the wafer obtained after the resist process step; a development step of developing the wafer exposed at the exposure step; an etching step of removing portions other than a resist image developed at the development step; and a resist stripping step of removing unnecessary resist following the completion of the etching. By repeating these steps, multiple circuit patterns are formed on the wafer.

When the exposure apparatus described above is employed to manufacture a semiconductor device, a highly integrated semiconductor device can be obtained.

While the present invention has been described with reference to exemplary embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application No. 2004-110837 filed Apr. 5, 2004, which is hereby incorporated by reference herein.

What is claimed is:

1. A stage apparatus, wherein a moving element on which an object is mounted is propelled across a stator, the moving element comprising:
   a coil unit, including coils, for generating a force to propel the moving element;
   a cooling unit for cooling the coil unit;
   a housing unit housing the coil unit; and
   a plurality of sheet thermal conductive members for transferring heat away from the coil unit,
   wherein the plurality of sheet thermal conductive members are arranged with one end in surface contact with each of the coils and the other end arranged in contact with the cooling unit or the housing unit housing the coil unit.

2. A stage apparatus according to claim 1, wherein the cooling unit is formed inside a first wall face of the housing unit.

3. A stage apparatus according to claim 2, wherein the sheet thermal conductive members contact the first wall face and the coils.

4. A stage apparatus according to claim 1, wherein the cooling unit internally includes a plurality of cooling pipes along which a coolant is circulated.

5. A stage apparatus according to claim 1, wherein the cooling unit has at least two cooling systems, and wherein temperatures for the two cooling systems are independently controlled.

6. A stage apparatus according to claim 1, wherein the sheet thermal conductive members are composed of thermal conductive anisotropic material.

7. A stage apparatus according to claim 1, wherein the sheet thermal conductive members contact a first wall face and a second wall face of the housing unit and the coils.

8. A stage apparatus according to claim 1,
   wherein the sheet thermal conductive members have a higher thermal conductivity in a first direction from the coils toward the cooling unit than in a second direction that is different from the first direction.

9. A moving element according to claim 8, wherein the cooling unit is formed inside a first wall face of the housing unit.

10. A moving element according to claim 9, wherein the sheet thermal conductive members each include a sheet member that contacts the first wall face and the coils.

11. A moving element according to claim 8, wherein the cooling unit internally includes a plurality of cooling pipes along which a coolant is circulated.

12. A moving element according to claim 8, wherein the cooling unit has at least two cooling systems, and wherein temperatures for the two cooling systems are independently controlled.

13. A moving element according to claim 8, wherein the sheet thermal conductive members each include a sheet member that contacts a first wall face and a second wall face of the housing unit and the coils.

14. A stage apparatus according to claim 1, wherein the thermal conductivities of the sheet thermal conductive members are equal to or larger than 10 w/(m·k).

15. A moving element according to claim 8, wherein the thermal conductivities of the sheet thermal conductive members are equal to or larger than 10 w/(m·k).

16. An exposure apparatus comprising:
- a stage apparatus, wherein a moving element on which an object is mounted is propelled across a stator, the moving element comprising:
  - a coil unit, including coils, for generating a force to propel the moving element;
  - a cooling unit for cooling the coil unit;
  - a housing unit housing the coil unit; and
  - a plurality of sheet thermal conductive members for transferring heat away from the coil unit,
  - wherein the plurality of sheet thermal conductive members are arranged with one end in surface contact with each of the coils and the other end arranged in contact with the cooling unit or the housing unit housing the coil unit.

17. A device manufacturing method comprising:
- providing an exposure apparatus, with the exposure apparatus comprising:
- a stage apparatus, wherein a moving element on which an object is mounted is propelled across a stator, the moving element comprising:
  - a coil unit, including coils, for generating a force to propel the moving element;
  - a cooling unit for cooling the coil unit;
  - a housing unit housing the coil unit; and
  - a plurality of sheet thermal conductive members for transferring heat away from the coil unit,
  - wherein the plurality of thermal conductive members are arranged with one end in surface contact with each of the coils and the other end arranged in contact with the cooling unit or the housing unit housing the coil unit.

* * * * *

UNITED STATES PATENT AND TRADEMARK OFFICE
CERTIFICATE OF CORRECTION

| | | |
|---|---|---|
| PATENT NO. | : 7,301,602 B2 | Page 1 of 1 |
| APPLICATION NO. | : 11/094311 | |
| DATED | : November 27, 2007 | |
| INVENTOR(S) | : Hitoshi Sato et al. | |

It is certified that error appears in the above-identified patent and that said Letters Patent is hereby corrected as shown below:

COLUMN 5:
        Line 27, "descried." should read -- described. --.

COLUMN 6:
        Line 50, "moving element" should read -- stage apparatus --.
        Line 54, "moving element" should read -- stage apparatus --.
        Line 57, "moving element" should read -- stage apparatus --.
        Line 60, "moving element" should read -- stage apparatus --.
        Line 64, "moving element" should read -- stage apparatus --.

COLUMN 7:
        Line 4, "moving element" should read -- stage apparatus --.

Signed and Sealed this

Fifteenth Day of July, 2008

JON W. DUDAS
*Director of the United States Patent and Trademark Office*